US006913972B2

United States Patent
Han et al.

(10) Patent No.: US 6,913,972 B2
(45) Date of Patent: Jul. 5, 2005

(54) METHOD OF FABRICATION ON A GATE PATTERN OF A NON-VOLATILE MEMORY DEVICE

(75) Inventors: Ja-hyung Han, Suwon (KR); Myung-sik Han, Suwon (KR); Kyung-hyun Kim, Seoul (KR); Chang-ki Hong, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 657 days.

(21) Appl. No.: 09/927,594

(22) Filed: Aug. 10, 2001

(65) Prior Publication Data

US 2002/0081796 A1 Jun. 27, 2002

(30) Foreign Application Priority Data

Dec. 26, 2000 (KR) ........................................ 2000-82057

(51) Int. Cl.[7] ............................................ H01L 21/336
(52) U.S. Cl. ....................................................... 438/257
(58) Field of Search .................................. 438/201, 211, 438/257, 258, 259, 260, 261, 262, 263, 264, 265, 266, 267, 593, 594, 626, 631, 633, 634, 697, 699; 257/314, 315, 316, 317, 318, 319, 320, 321, 322, 323, 324, 325, 326

(56) References Cited

U.S. PATENT DOCUMENTS 5,355,332 A * 10/1994 Endoh et al.
6,018,195 A * 1/2000 Takebuchi
6,350,654 B1 * 2/2002 Sheu et al.
6,492,674 B1 * 12/2002 Komori \* cited by examiner

*Primary Examiner*—Nathan J. Flynn
*Assistant Examiner*—Kevin Quinto
(74) *Attorney, Agent, or Firm*—F. Chau & Associates, LLC

(57) ABSTRACT

A method for fabricating a non-volatile memory device is provided. The method for fabricating a non-volatile memory device includes the steps of: forming a gate pattern in which a first conductive layer is used as a floating gate, a second conductive layer is used as a control gate, the first conductive layer, a dielectric layer, and the second conductive layer are sequentially stacked on a semiconductor substrate; forming a polishing stopper on the gate pattern and the semiconductor substrate; forming an interlayer insulating layer on the polishing stopper; forming a common source line (CSL) by etching a portion of the interlayer insulating layer, and a portion of the polishing stopper, and depositing a conductive material to the etched portions; planarizing the common source line and the interlayer insulating layer until the surface of the polishing stopper is exposed; partially etching back the polishing stopper until the surface of the second conductive layer is exposed; and forming a silicide layer on the exposed second conductive layer and the common source line.

17 Claims, 6 Drawing Sheets

METHOD OF FABRICATION ON A GATE PATTERN OF A NON-VOLATILE MEMORY DEVICE

BACKGROUND OF THE INVENTION

1. Field of the Invention

The present invention relates to a method for fabricating a non-volatile memory device, and more particularly to a method for fabricating a NAND type flash memory device.

2. Discussion of Related Art

Among the several types of read-only memory (ROM) devices, a flash memory device, a type of non-volatile EEPROM (Electrically Erasable & Programmable Read Only Memory) device, is widely used for computers, digital still cameras and similar devices.

Flash memory devices can be of two types, namely, a NOR type and a NAND type. The NOR type flash memory device is not readily applicable to realization in high integration because one contact is required for every two cells. However, the NOR type flash memory device is typically faster than a NAND type flash memory device and is therefore more suitable for high-speed operation. On the contrary, the NAND type flash memory device can be densely integrated on a chip because a plurality of cells share one contact. Therefore, the NAND type flash memory device is receiving considerable attention for use in the next generation memory.

FIGS. 1 through 3 illustrate a conventional method for fabricating a NAND type flash memory. Referring to FIG. 1, gate patterns 20 are formed on a semiconductor substrate on which a gate oxide layer 12 is formed. The gate patterns 20 are formed by sequentially stacking a first polysilicon layer 14 used as a floating gate, a dielectric layer 16, a second polysilicon layer 18 used for a control gate, a silicide layer 22, and a gate insulating layer 24.

Referring to FIG. 2, a capping layer 26 made of an nitride layer is deposited on the whole surface of the semiconductor substrate 10 on which the gate patterns 20 are formed. Then, an interlayer insulating layer 28 made of an oxide layer is thickly deposited so as to fill the gap between the gate patterns 20, and is planarized by Chemical Mechanical Polishing (CMP) process. The CMP process of the interlayer insulating layer 28 is performed until the surface of the capping layer 26 is exposed to act as a blocking layer.

Referring to FIG. 3, a common source line (CSL) 30 for commonly connecting a plurality of bit lines to a source is formed between the gate patterns 20. To form the CSL 30, after removing a part of the interlayer insulating layer 28, the capping layer 26 and the gate oxide layer 12 in order between the gate patterns 20, a conductive material is deposited on the insulating layer 28 and to fill the removed part. Then, the conductive material is planarized by a second CMP process until the surface of the interlayer insulating layer 28 is exposed.

According to the above conventional method, the fabrication process for a NAND type flash memory requires repeated CMP processes (i.e., twice) to form the CSL 30. Furthermore, after the interlayer insulating layer 28 is planarized by CMP, the height of the interlayer insulating layer is still high because the gate pattern 20 includes the silicide layer 22.

SUMMARY OF THE INVENTION

A method for fabricating a non-volatile memory device is provided comprising the steps of: forming a gate pattern in which a first conductive layer is used as a floating gate, a second conductive layer is used as a control gate, the first conductive layer, a dielectric layer, and the second conductive layer are sequentially stacked on a semiconductor substrate; forming a polishing stopper on the gate pattern and the semiconductor substrate; forming an interlayer insulating layer on the polishing stopper; forming a common source line (CSL) by etching a portion of the interlayer insulating layer, and a portion of the polishing stopper, and depositing a conductive material to the etched portions; planarizing the common source line and the interlayer insulating layer until the surface of the polishing stopper is exposed; partially etching back the polishing stopper until the surface of the second conductive layer is exposed; and forming a silicide layer on the exposed second conductive layer and the common source line.

According to an aspect of the invention, an oxide layer is already formed on the semiconductor substrate. And the oxide layer is formed to a thickness of about 50 angstrom to about 200 angstrom. The first conductive layer and the second conductive layer is a doped polysilicon layer.

According to a preferred embodiment of the present invention, the dielectric layer is multi-layer including an oxide layer and a nitride layer and the dielectric layer is formed to a thickness of about 100 angstrom to about 200 angstrom.

According to an aspect of the invention, the gate pattern further includes an insulating layer additionally formed on the second conductive layer, and the insulating layer is preferably formed with one of a mono-layer nitride layer and a multi-layer containing a nitride layer.

The method further includes the step of forming spacers on side walls of the gate pattern. It is preferably that the spacers are formed with one of a mono-layer nitride layer and multi-layer nitride layer.

According to an aspect of the invention, the polishing stopper is made of a nitride layer. The interlayer insulating layer is preferably one of an oxide layer and a multi-layer including an oxide layer. The conductive material for forming the common source line is made of polysilicon containing impurities.

The step of etching back the polishing stopper is performed by a wet etching method using phosphoric acid or by a dry etching method.

According to a preferred aspect of the present invention, the silicide layer is a silicide selected from the silicide group consisting of cobalt silicide (CoSix), tungsten silicide (WSix) and aluminum silicide (AlSix).

A semiconductor non-volatile memory device formed by the process steps is also provided which comprises: forming a gate pattern on a semiconductor substrate, the gate pattern having first and second conductive layers and a dielectric layer therebetween; forming a polishing stopper on the gate pattern and the semiconductor substrate; forming an insulating layer on the polishing stopper; forming a common source line (CSL) by etching a portion of the interlayer insulating layer, and a portion of the polishing stopper, and depositing a conductive material; then, planarizing the common source line and the interlayer insulating layer until the surface of the polishing stopper is exposed; partially etching back the polishing stopper until the surface of the second conductive layer is exposed; and forming a silicide layer on the exposed second conductive layer and the common source line.

BRIEF DESCRIPTION OF THE DRAWINGS

The advantages of the present invention will become more apparent by describing in detail preferred embodiments thereof with reference to the attached drawings in which.

DETAILED DESCRIPTION OF PREFERRED EMBODIMENTS

The present invention now will be described more fully hereinafter with reference to the accompanying drawings, in which preferred embodiments of the invention are shown.

Figure 1:
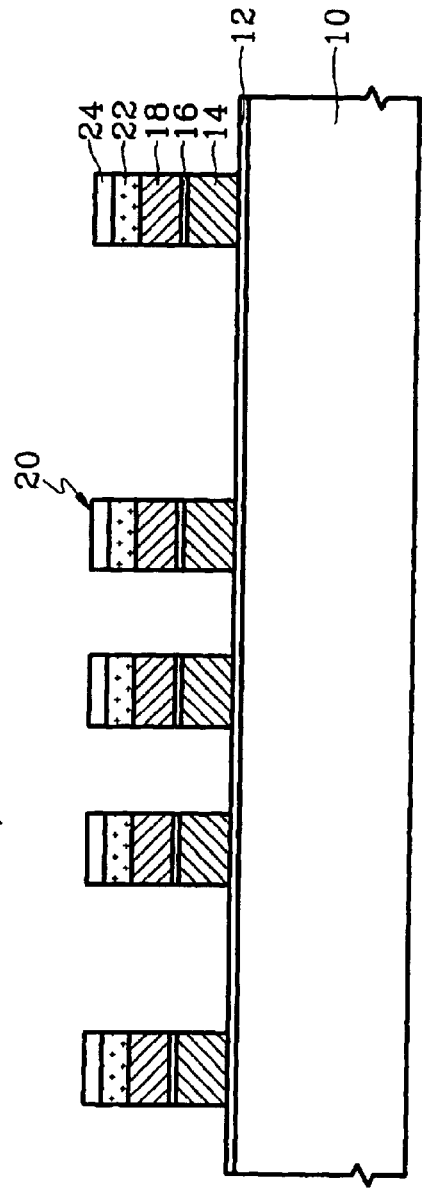
FIGS. 1 through 3 are cross sectional views of structures which illustrate a conventional method for fabricating a non-volatile memory device, in particular a NAND type flash memory.
Figure 2:
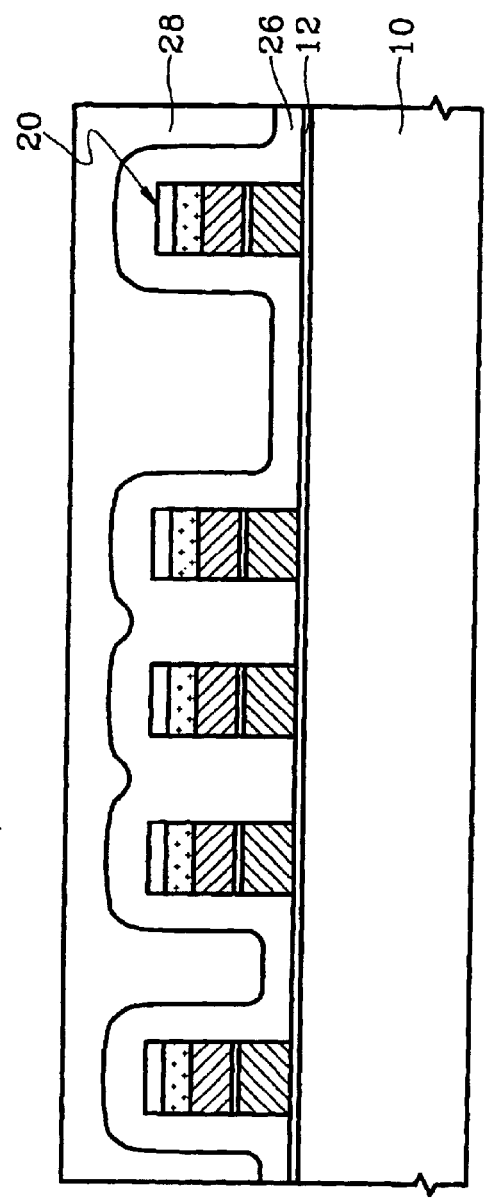
Figure 3:
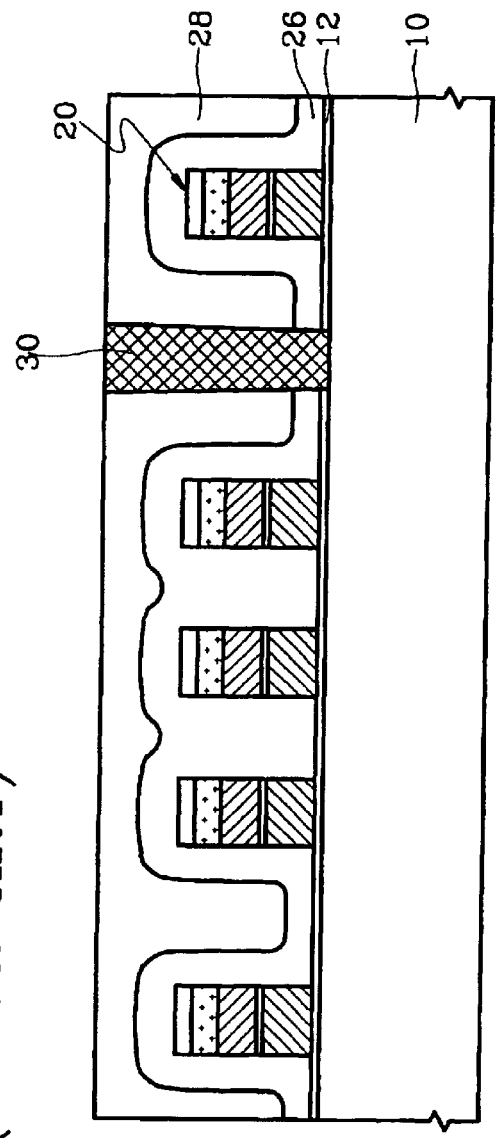
Figure 4:
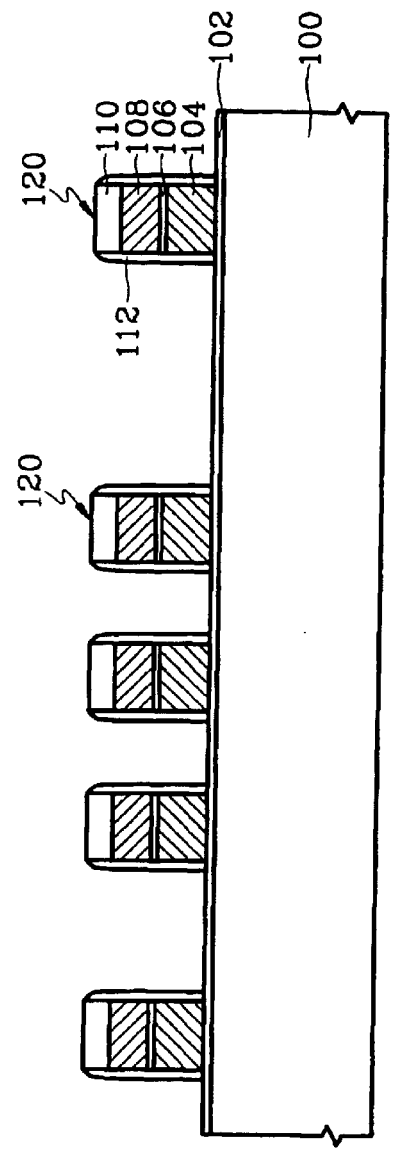
FIGS. 4 through 9 are cross sectional views for illustrating a method for fabricating a non-volatile memory device according to the present invention.

FIGS. 4 through 9 are schematic sectional views for describing a fabricating method of NAND type flash memory among non-volatile memory devices according to a preferred embodiment of the present invention. Referring to FIG. 4, gate patterns 120 are formed on a semiconductor substrate 100 in which a gate oxide layer 102 is formed. The gate oxide layer 102, usually called a tunnel oxide layer, is formed by growing an oxide film or oxynitride film on the active region of the semiconductor substrate 100 to a thickness of about 50 to about 200. The gate patterns 120 are formed in a structure having a first conductive layer 104, a dielectric layer 106, and a second conductive layer 108 stacked sequentially. The first conductive layer 104 to be used as a floating gate is a doped polysilicon layer. To isolate the floating gate from a control gate on the structure, a multi-layer consisting of an oxide layer and a nitride layer, for example, an ONO (Oxide/Nitride/Oxide) layer is formed as the dielectric layer 106. The dielectric layer 106 has a thickness of about 100 to about 200. The second conductive layer 108 to be used a control gate is a doped polysilicon layer.

If necessary, an insulating layer 110 can be additionally formed on the second conductive layer 108 and spacers 112 can also be formed on the sides of the gate patterns 120 upon which the insulating layer 110 is formed. The insulating layer 110 and the spacers 112 are preferably formed with a mono-layer of a nitride or a multi-layer containing a nitride layer.

Figure 5:
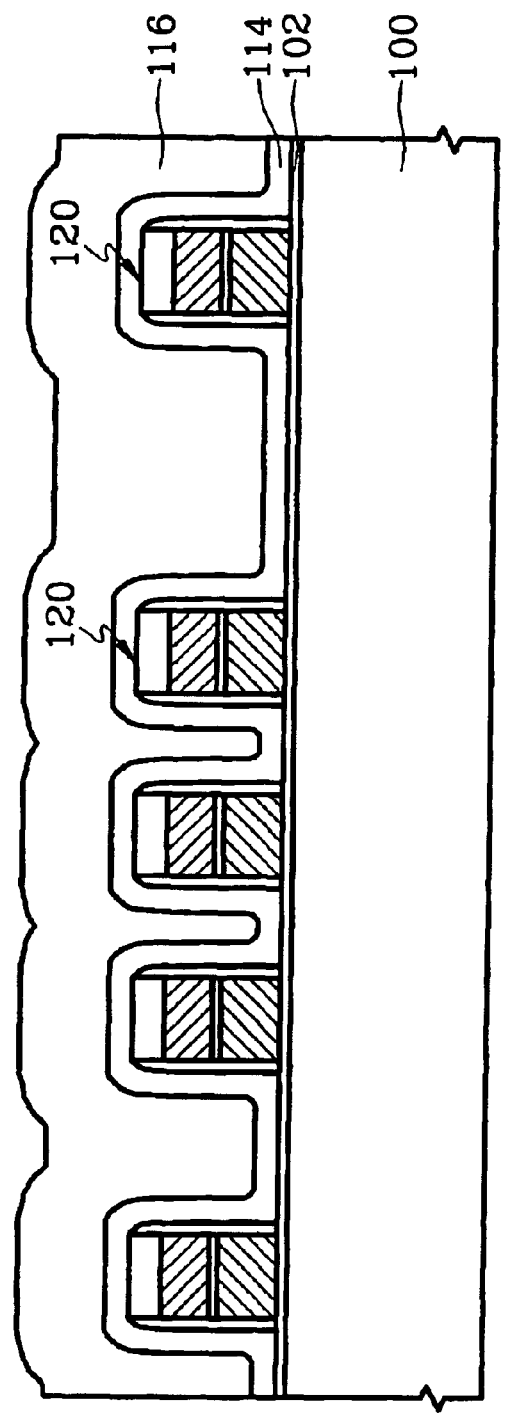

Referring to FIG. 5, a polishing stopper 114 is formed by depositing a nitride layer on the resultant structure having the gate patterns 120. Then an interlayer insulating layer 116, such as an oxide layer or a multi layer including an oxide layer is deposited on the polishing stopper 114 so as to completely cover the gate patterns 120.

Figure 6:
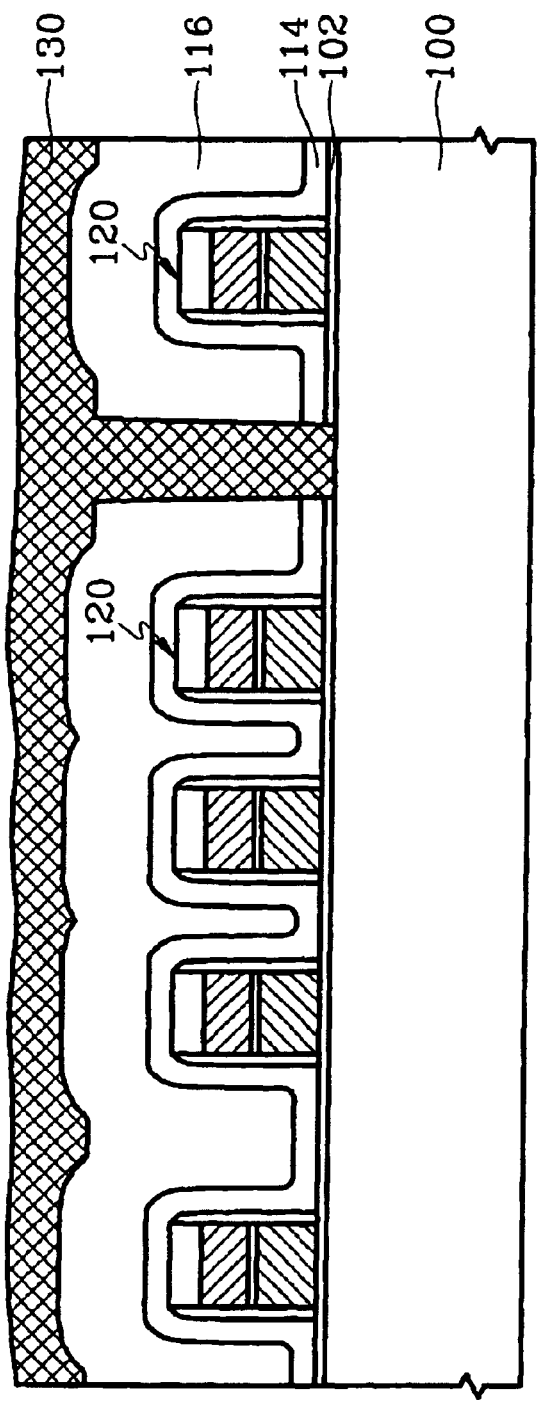

Referring to FIG. 6, a common source line(CSL) is to be formed which occupies a region 121 comprising a part of the interlayer insulating layer 116, a part of the polishing stopper 114, and a part of the gate oxide layer 102. Preferably, the part of interlayer insulating layer 116, the part of the polishing stopper 114, and the part of the gate oxide layer 102 are sequentially etched using mask (not shown). The etching process is preferably performed without planarizing the interlayer insulating layer 116. Then, a CSL conductive layer 130, for example, a polysilicon layer including impurities such as $POCl_3$, is formed on the etched portion and on the interlayer insulating layer 116.

Figure 7:
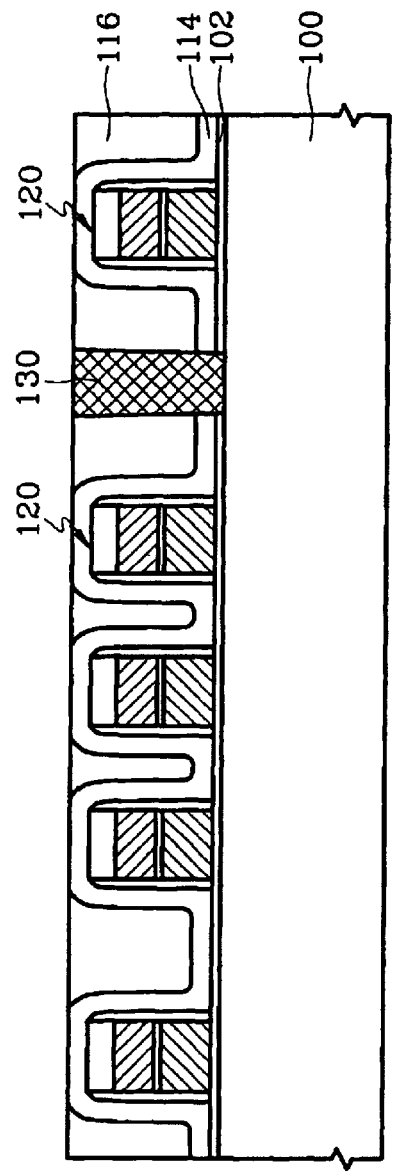

Referring to FIG. 7, the semiconductor substrate 100 having the CSL conductive layer 130 (FIG. 6) is planarized by CMP process. The CMP process continues until the top surface of the polishing stopper 114 is exposed, so that a planarized interlayer insulating layer 118 and a common source line (CSL) 132 are formed. The CMP process according to a preferred embodiment of the present invention simultaneously planarizes the both the interlayer insulating layer 116 and the CSL conductive layer 130. Accordingly, the two-step CMP processes required in a conventional method for manufacturing a NAND type flash memory can be reduced to a one-step CMP process. And the planarized interlayer insulating layer 118 is thinner than that achieved by a conventional method.

Figure 8:
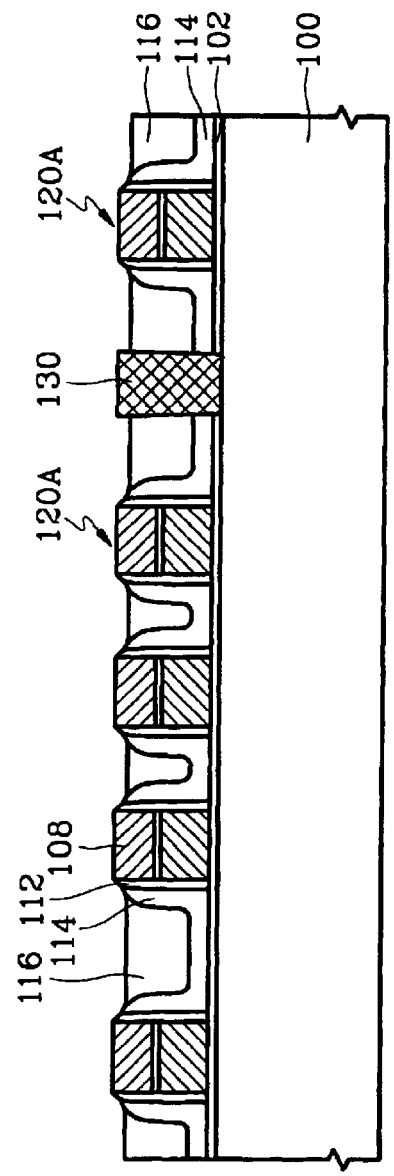

Referring to FIG. 8, the top surface of the second conductive layer 108 is exposed by performing an etch-back process on the semiconductor substrate 100 on which the planarizing process has been performed. The etch-back process can be performed by either a wet-etching method using an etching solution having a high etching selection ratio to a nitride layer, such as phosphoric acid, or a dry-etching method. During the etch-back process, the polishing stopper 114 on the second conductive layer 108 and the top portion of the planarized interlayer insulating layer 118 are removed, and the CSL 132 are slightly etched out. Accordingly, the surfaces of the second conductive layer 108 and the CSL 132 are slightly extruded from the resultant surface. According to the present embodiment of the invention, the insulating layer 110 that was formed on the second conductive layer 108 is also etched out.

Figure 9:
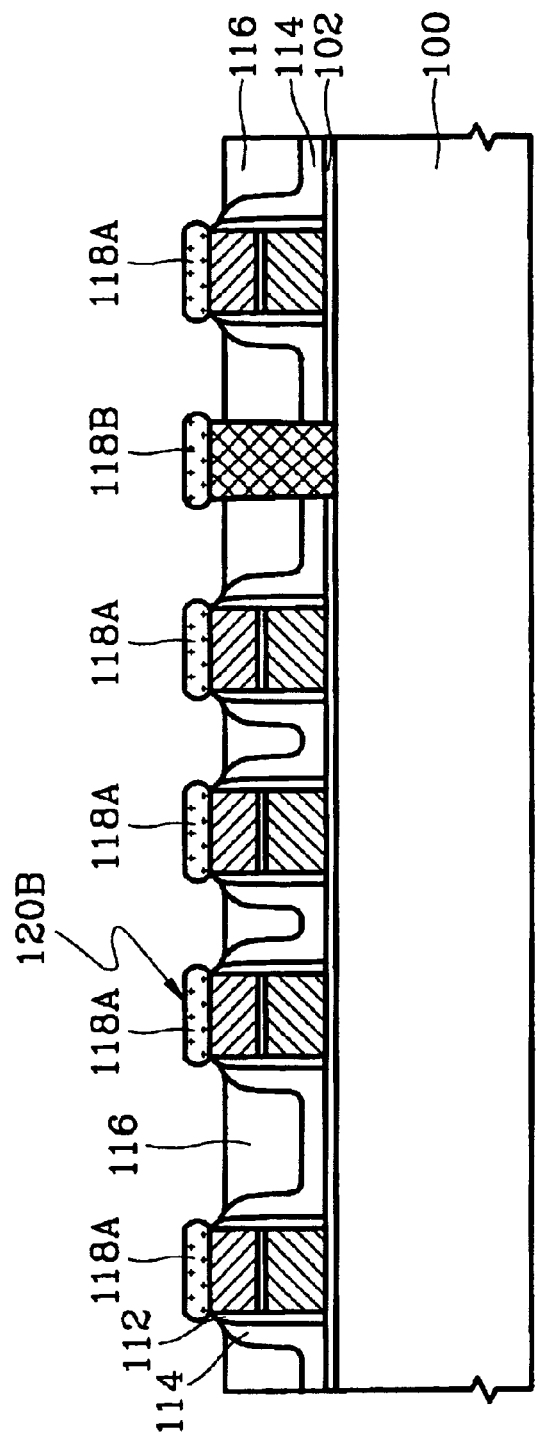

Referring to FIG. 9, a metal layer such as cobalt layer or tungsten layer for forming silicide is deposited with a uniform thickness on the resultant structure including the exposed second conductive layer 108 and CSL 132. Then, a heat treatment process is performed on the semiconductor substrate 100 on which the metal layer is formed. As a result, a silicide layer such as cobalt silicide (CoSix) or tungsten silicide (Wsix) is formed on the second conductive layer 108 and the CSL 132. Here, the 118A denotes a silicide on the second conductive layer 108 and 118B denotes a silicide on the CSL 132. However, the silicidation reaction does not occur on the insulating layers such as the planarized interlayer insulating layer 118 and the polishing stopper 114 because the insulating layers do not contain silicon. Finally, the metal layer on which the silicidation reaction does not occur is removed by performing a cleaning process and then, the silicide layers 118A and 118B remain on the second conductive layer 108 and the CSL 132, respectively. As mentioned above, even if the NAND type flash memory is useful in realizing high integration, it may be slower than the NOR type flash memory device in terms of the operational speed. According to the present invention, the silicide layers 118A and 118B can improve the operation speed of a NAND type flash memory device. And as the silicide layers 118A and 118B are formed after planarizing the interlayer insulating layer 116, the thickness of the planarized interlayer insulating layer 118 is thinner than the interlayer insulating layer formed from the conventional method.

Advantages derived from the present invention includes: first, the processes for planarizing the interlayer insulating layer 116 and the CSL conductive material 130 are carried out at the same time, thereby simplifying the whole fabricating process of a non-volatile memory device.

Second, as the silicide layers 118A and 118B are formed after planarizing the interlayer insulating layer 116, the height of the gate pattern is lowered, thereby reducing the thickness of the planarized interlayer insulating layer 118.

Third, the silicide layers 118A and 118B are formed in a process subsequent to the formation of the gate pattern 120, thereby improving the operational speed of a semiconductor device.

Although the present invention has been described herein with reference to the accompany drawings, it is to be understood that the present invention is not limited to those precise embodiments, and various other changes and modifications may be affected therein by one skilled in the art without departing from the scope or sprit of the present invention. All such changes and modifications are intended to be included within the scope of the invention as defined by the appended claims.

What is claimed is:

1. A method for fabricating a non-volatile memory device, comprising the steps of:

forming a gate pattern in which a first conductive layer is used as a floating gate, a second conductive layer is used as a control gate, the first conductive layer, a dielectric layer, and the second conductive layer are sequentially stacked on a semiconductor substrate;

forming a polishing stopper on the gate pattern and the semiconductor substrate;

forming an interlayer insulating layer on the polishing stopper;

forming a common source line (CSL) by etching a portion of the interlayer insulating layer, and a portion of the polishing stopper, and depositing a conductive material to the etched portions;

planarizing the common source line and the interlayer insulating layer until the surface of the polishing stopper is exposed;

partially etching back the polishing stopper until the surface of the second conductive layer is exposed; and forming a silicide layer on the exposed second conductive layer and the common source line.

2. The method for fabricating a non-volatile memory device of claim 1, wherein an oxide layer is formed on the semiconductor substrate.

3. The method for fabricating a non-volatile memory device of claim 2, wherein the oxide layer is formed to a thickness of about 50 angstrom to about 200 angstrom.

4. The method for fabricating a non-volatile memory device of claim 1, wherein the first conductive layer and the second conductive layer is a doped polysilicon layer.

5. The method for fabricating a non-volatile memory device of claim 1, wherein the dielectric layer is a multi-layer comprising an oxide layer and a nitride layer.

6. The method for fabricating a non-volatile memory device of claim 1, wherein the dielectric layer is formed to a thickness of about 100 angstrom to about 200 angstrom.

7. The method for fabricating a non-volatile memory device of claim 1, wherein the gate pattern further comprises an insulating layer additionally formed on the second conductive layer.

8. The method for fabricating a non-volatile memory device of claim 7, wherein the insulating layer is formed with one of a mono-layer nitride layer and a multi-layer containing a nitride layer.

9. The method for fabricating a non-volatile memory device of claim 1, further including the step of forming spacers on side walls of the gate pattern.

10. The method for fabricating a non-volatile memory device of claim 9, wherein the spacers are formed with one of a mono-layer nitride layer and a multi-layer containing a nitride layer.

11. The method for fabricating a non-volatile memory device of claim 1, wherein the polishing stopper is made of a nitride layer.

12. The method for fabricating a non-volatile memory device of claim 1, wherein the interlayer insulating layer is an oxide layer or a multi-layer including an oxide layer.

13. The method for fabricating a non-volatile memory device of claim 1, wherein the conductive material for forming the common source line is made of polysilicon containing impurities.

14. The method for fabricating a non-volatile memory device of claim 1, wherein the step of etching back the polishing stopper is performed by a wet etching method using phosphoric acid.

15. The method for fabricating a non-volatile memory device of claim 1, wherein the step of etching back the polishing stopper is performed by a dry etching method.

16. The method for fabricating a non-volatile memory device of claim 1, wherein the silicide layer is a silicide selected from the silicide group consisting of cobalt silicide (CoSix), tungsten silicide (WSix) and aluminum silicide (AlSix).

17. The method for fabricating a non-volatile memory device of claim 1, wherein the non-volatile memory device is a NAND type flash memory.

* * * * *